US007521961B1

(12) United States Patent
Anderson

(10) Patent No.: US 7,521,961 B1
(45) Date of Patent: Apr. 21, 2009

(54) METHOD AND SYSTEM FOR PARTIALLY RECONFIGURABLE SWITCH

(75) Inventor: James B. Anderson, Santa Cruz, CA (US)

(73) Assignee: XILINX, Inc., San Jose, CA (US)

( * ) Notice: Subject to any disclaimer, the term of this patent is extended or adjusted under 35 U.S.C. 154(b) by 76 days.

(21) Appl. No.: 11/657,417

(22) Filed: Jan. 23, 2007

(51) Int. Cl.
*H03K 19/177* (2006.01)
(52) U.S. Cl. .......................................... 326/41; 326/47
(58) Field of Classification Search .............. 326/37–41, 326/47
See application file for complete search history.

(56) References Cited

U.S. PATENT DOCUMENTS

| 5,946,219 | A  | * | 8/1999  | Mason et al. ................. 716/16 |
| 6,693,456 | B2 | * | 2/2004  | Wong ........................... 326/41 |
| 6,725,441 | B1 | * | 4/2004  | Keller et al. ................... 716/16 |
| 6,759,869 | B1 | * | 7/2004  | Young et al. ................... 326/41 |
| 7,149,996 | B1 | * | 12/2006 | Lysaght et al. ................. 716/16 |
| 7,185,309 | B1 | * | 2/2007  | Kulkarni et al. ............... 716/18 |
| 2002/0080771 | A1 | * | 6/2002 | Krumel ....................... 370/352 |
| 2003/0066057 | A1 | * | 4/2003 | RuDusky ..................... 717/140 |
| 2004/0073899 | A1 | * | 4/2004 | Luk et al. .................... 717/158 |
| 2005/0021871 | A1 | * | 1/2005 | Georgiou et al. ............. 709/250 |
| 2006/0190904 | A1 | * | 8/2006 | Haji-Aghajani et al. ....... 716/17 |
| 2007/0088537 | A1 | * | 4/2007 | Lertora et al. ................. 703/28 |

OTHER PUBLICATIONS

Murali, Srinivasan et al.; "SUNMAP: A Tool For Automatic Topology Selection And Generation For NoCs", Jun. 7, 2004, 1-6 pps., DAC 2004, available from Xilinx, Inc., 2100 Logic Drive, San Jose, CA 95124.
Xilinx, Inc., "High Performance Crossbar Switch For Virtex-II and Virtex-II Pro FPGAs", 2002, 2 pages, available from Xilinx, Inc., 2100 Logic Drive, San Jose, CA 95124, month n/a.
Xilinx, Inc., "High-Speed Buffered Crossbar Switch Design Using Virtex-EM Devices", XAPP240, Mar. 14, 2000, pp. 1-7, available from Xilinx, Inc., 2100 Logic Drive, San Jose, CA 95124.

* cited by examiner

*Primary Examiner*—Rexford Barnie
*Assistant Examiner*—Jason Crawford
(74) *Attorney, Agent, or Firm*—Pablo Meles; LeRoy D. Maunu

(57) ABSTRACT

A system and method of configuring a partially reconfigurable switch includes a pipelined partially reconfigurable switch interconnect may include a desired subset of connections in a switch interconnect, a partial bitstream defined for each of the desired subset of connections stored in a memory such as SRAM serving as a buffer, and a controller for cyclically applying the partial bitstream to the switch interconnect. The controller may determine a connection instance and duration for each client access of the switch interconnect in a synchronous manner. A clear to send (CTS), receive data (RD), destination address, and source address at each client may be sent with each partial bitstream for each desired subset of connections. The partially reconfigurable switch and a plurality of partially reconfigurable slot clients may be formed in a silicon backplane.

20 Claims, 6 Drawing Sheets

40

METHOD AND SYSTEM FOR PARTIALLY RECONFIGURABLE SWITCH

FIELD OF THE INVENTION

This invention relates generally to interconnect switches, and more particularly to a method and system for constructing an interconnect fabric such as a Network on Chip (NoC) interconnect fabric based upon a partially reconfigurable switch.

BACKGROUND OF THE INVENTION

As chip capacity continues to increase significantly, the use of field programmable gate arrays (FPGAs) is quickly replacing the use of application specific integrated circuits (ASICs). An ASIC is a specialized integrated circuit that is designed for a particular application and can be implemented as a specialized microprocessor. Notably, a FPGA is a programmable logic device (PLD) that has an extremely high density of electronic gates as compared to an ASIC. This high gate density has contributed immensely to the popularity of FPGA devices. Notably, FPGAs can be designed using a variety of architectures that can include user configurable input/output blocks (IOBs), and programmable logic blocks having configurable interconnects and switching capability. In some instances, a programmable logic device may include devices that are partially programmable.

The advancement of computer chip technology has also resulted in the development of embedded processors and controllers and even embedded networks having multiple linked devices. An embedded processor or controller can be a microprocessor or microcontroller circuitry that has been integrated into an electronic device as opposed to being built as a standalone module or "plugin card." Advancement of FPGA technology has led to the development of FPGA-based system-on-chip (SoC) and network-on-chip (NoC) including FPGA-based embedded processor SoCs. A SoC is a fully functional product having its electronic circuitry contained on a single chip. While a microprocessor chip requires ancillary hardware electronic components to process instructions, SoC would include all required ancillary electronics. As platform architectural forms, SoC and NoC are nominally understood to include at least one processor-element. An obvious conceptual extension is instancing of multiple processor elements coupled to each other via a bus (SoC) or network (NoC). A simple example is a cellular telephone SoC that includes a microprocessor, encoder, decoder, digital signal processor (DSP), RAM and ROM, (e.g., two processing elements are part of the system). In this context, processing elements are not restricted to microprocessor; for example RISC (reduced instruction set computer or controller), DSP, Micro-Controller, and cyclostatic processing engines are all allowed.

In order for device manufacturers to develop FPGA-based SoCs or FPGA-based embedded processor SoCs, it is necessary for them to acquire intellectual property rights for system components and/or related technologies that are utilized to create the FPGA-based SoCs. These system components and/or technologies are called cores or Intellectual Property (IP) cores. An electronic file containing system component information can typically be used to represent the core. A device manufacturer will generally acquire several cores that are integrated to fabricate the SoC. More generically, the IP cores can form one or more of the processing modules in an FPGA-based SoCs. The processing modules can either be hardware or software based.

Notwithstanding advantages provided by using FPGA-based SoCs, the development of these SoCs can be very challenging. One of the challenges includes communication among multiple hardware and software processors embedded in a FPGA-based SoC. Typically, such communication occurs over a bus. Unfortunately, bus-based communications performance is fundamentally limited by bandwidth-sharing and arbitration overhead. Therefore, several clock cycles may be required for simple communication among processing modules. Furthermore, type dependencies are not easily supported in the bus communication link physical layer. Network-on-Chip (NoC) is one means by which these limitations may be overcome. However, NoC is also accompanied by relatively high complexity and resource utilization.

A partially reconfigurable-SWITCH (pr-SWITCH) has been proposed as architectural basis for a Network-on-Chip interconnect fabric, alternative to traditional BUS/Platform interconnect. In this context, pr-SWITCH is understood to include partially reconfigurable crossbar and Clos-Switch constructs. Standard crossbar hardware architecture includes a multiplexer bank capable of supporting N-concurrent source-to-sink interconnects. The partially reconfigurable version implements some multiplexer subset capable of supporting M<N concurrent interconnects based upon an applied partial configuration bitstream. Any subset of all possible cross-connections may then be established with successive application of characteristic partial bitstreams, based upon combination of demand-driven partial reconfiguration and multiplexer control mechanisms. In similar fashion, partially reconfigurable Clos-Switch constructs implement reduced multi-layer multiplexer banks collectively spanning all supported K-of-N interconnects. Stated differently, the partially reconfigurable Clos-Switch implements a given K-of-N architecture in form of some spanning-set of partial bitstreams corresponding to smaller Clos-Switch structures. Note, in both cases, multiplexer inputs may be structurally reduced with a concomitant increase of the set of partial bitstreams needed to span all possible connections. At the point where the number of multiplexer inputs is reduced to one, all connections devolve to unitary cross-connections, and associated multiplexer control is eliminated. Major advantages of such pr-SWITCH constructs include reduction of; (1) hardware logic, (2) multiplexer control envelope, and (3) interconnect resource requirements. These advantages are relevant to consideration of pr-SWITCH-based Network-on-Chip. However, additional problems then emerge in form of; (1) average bandwidth that might be supported at any specified source-to-sink connection, (2) bandwidth loss due to partial reconfiguration overhead, and (3) complexity associated with implementation of a network access protocol in combination with partial reconfiguration and multiplexer controls. It would be desirable to have a method and system for enabling a pr-SWITCH-based Network-on-Chip in the context of programmable logic or FPGAs, and that further overcomes the described problems.

SUMMARY OF THE INVENTION

Embodiments herein involve the application of a partially reconfigurable SWITCH (pr-SWITCH) concept using stored connections or configurations or definitions that are applied in cyclic-pipeline fashion to the partially reconfigurable switch. The application of definitions in one embodiment may be applied to a lossless K-of-N switch/crossbar interconnect. In this context, the term "lossless" is seen to imply guaranteed point-to-point bandwidth, no partial reconfiguration temporal overhead, and no protocol arbitration losses. Note again, 'K-of-N' refers to 'K' interconnections out of 'N' possible interconnections.

In a first aspect of the present invention, a method of configuring a partially reconfigurable switch may include the steps of defining a desired subset of connection configurations among a plurality of possible connections, storing definitions of the desired subset of connection configurations in a memory, and applying the definitions cyclically to the partially reconfigurable switch in a pipeline fashion. Defining the desired subset of connection configurations may involve defining a plurality of partial bitstreams. Applying the definitions cyclically may be done in a synchronous manner. Storing definitions may be done by placing the definitions in a static random access memory serving as a configuration repository buffer. The method may further include the step of applying the partial bitstream as a background process such that network traffic is concurrent with application of the partial bitstream. As result, the method may further include hiding reconfiguration time part and parcel of Network-on-Chip (NoC) traffic management, and elimination of all arbitration used for access by clients in a NoC system.

In accordance with a second aspect of the present invention, a pipelined partially reconfigurable switch interconnect may include a desired subset of connections in a switch interconnect, a partial bitstream defined for each of the desired subset of connections stored in a memory (such as SRAM) serving as a buffer, and a controller for cyclically applying the partial bitstream to the switch interconnect. The controller may determine a connection instance and duration for each client access of the switch interconnect in a synchronous manner. The controller may be a hardware or software based finite state machine, using a configuration plane access port and an associated block random access memory. The switch interconnect may further include a context switch for synchronous activation of a new set of network connections in a network on chip (NoC) configuration. Transaction protocol signals at each client may be included with each partial bitstream for each desired connection subset. Examples include, Clear To Send (CTS), Receive Data (RD), destination-ADDRess (d-ADDR), and source-ADDRess (s-ADDR). Partial bitstreams associated with selected K-of-N switch configurations are applied to a partial reconfiguration slot bank. Concurrent with active network traffic in some slot bank subset, a new network configuration partial bitstream may be loaded into an inactive configuration slot. Upon completion, a context switch is applied by which an existing K-of-N connection is replaced with a new K-of-N connection. Effectively, an active slot is deactivated and replaced with the previously inactive slot. In this fashion, the partially reconfigurable switch and a plurality of partially reconfigurable slot clients may be formed into a silicon backplane structure.

In accordance with a third embodiment of the present invention, a pipelined partially configurable switch interconnect may include a plurality of K-of-N interconnect ensembles providing partial bitstreams and a silicon backplane construct coupled to the plurality of interconnect ensembles, where the partial bitstreams are applied in a cyclically permutated order to the silicon backplane. A total cyclical permutated K-of-N time slot may be maintained sufficiently large to completely hide partial reconfiguration times. The switch interconnect may further include a context switch where the application of a partial bitstream is pipelined with a current partial bitstream instance in a synchronous and lossless manner with the context switch. Depending upon specific implementation employed, transaction control signals are included with each K-of-N partial bitstream. Examples of such are; Clear To Send (CTS), Receive Data (RD), destination-ADDRess (d-ADDR), and source-ADDRess (s-ADDR). The switch interconnect may further include reserve peripheral memory that stores partial reconfigurable partial bitstreams in static random access memory. The switch interconnect may further include a software (processor) or hardware Finite State Machine (FSM) pipeline controller coupled to the switch interconnect.

DETAILED DESCRIPTION OF THE DRAWINGS

Field programmable gate arrays (FPGA) have become very popular for telecommunication applications, Internet applications, switching applications, routing applications, and a variety of other end user applications. An FPGA 10 includes programmable logic fabric (containing programmable logic gates and programmable interconnects) and programmable input/output blocks. The programmable input/output blocks are fabricated on a substrate supporting the FPGA and are coupled to the pins of the integrated circuit, allowing users to access the programmable logic fabric. The programmable logic fabric may be programmed to perform a wide variety of functions corresponding to particular end user applications and may be implemented in a variety of ways. Other FPGA embodiments may include different architectures or arrangements, for example the input/output blocks may be distributed within programmable logic fabric. Furthermore, and FPGA may include other blocks or circuits, such as processors, memory, DSP blocks, multipliers, clock managers, high speed transceivers, etc., and the various blocks may be, for example, organized into columns.

Figure 1:
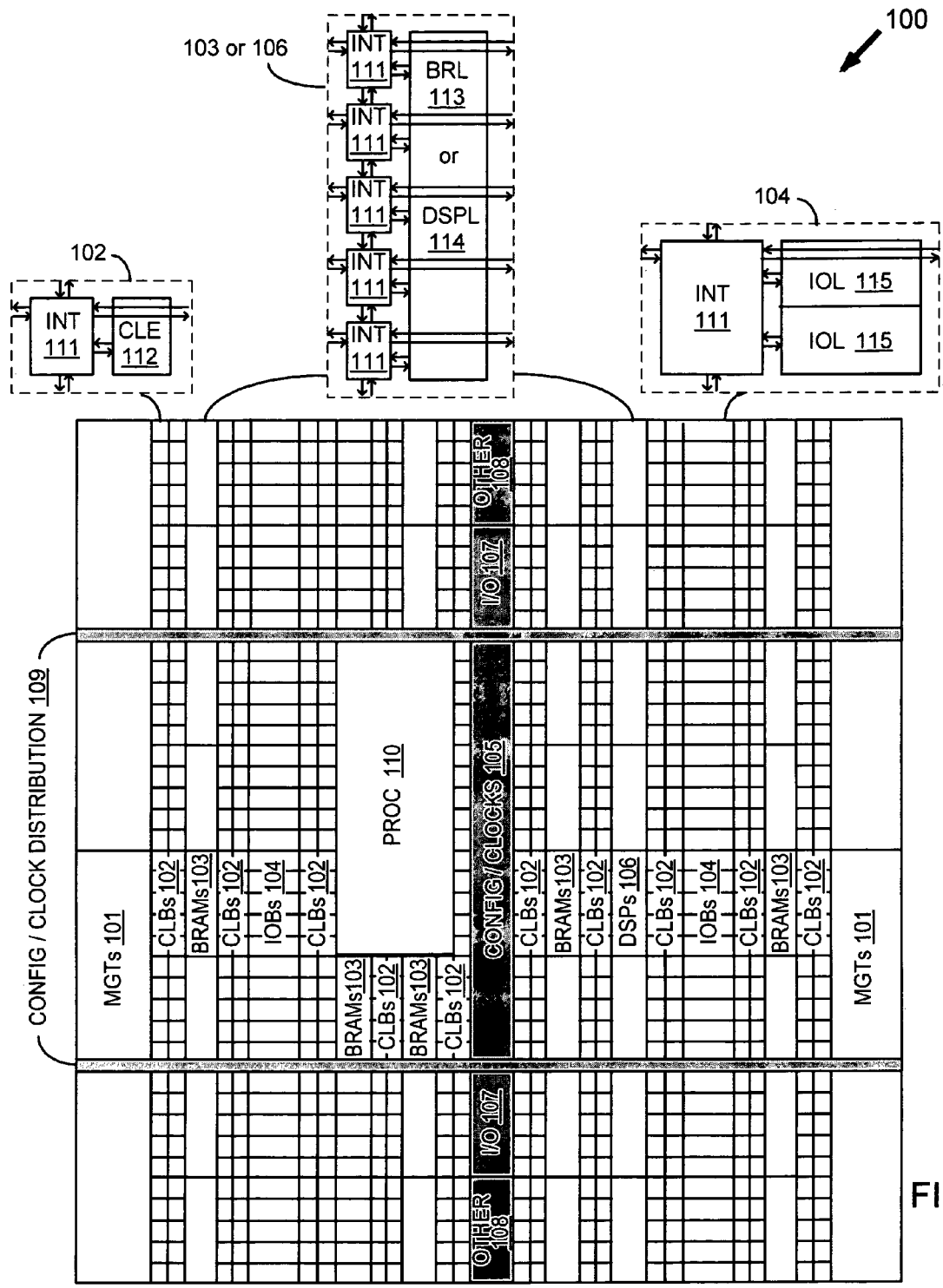
FIG. 1 illustrates a block diagram of a field programmable gate array.

Advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107)

(e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
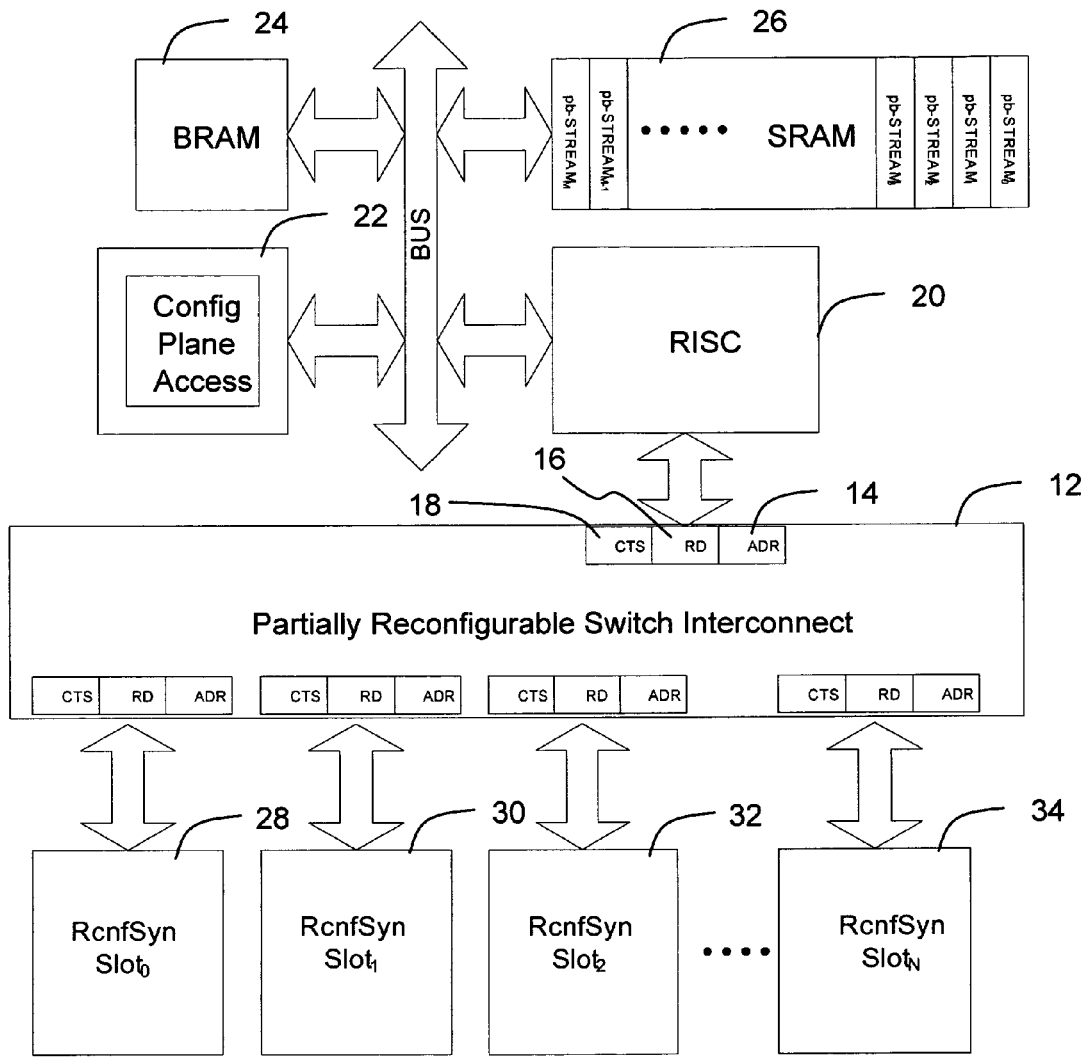
FIG. 2 illustrates a schematic block diagram of a system employing partially reconfigurable slot clients in combination with a pipelined partially reconfigurable switch interconnect construct in accordance with an embodiment of the present invention.

FIG. 2 illustrates a pr-SWITCH interconnect fabric 12 in a system 20 where pr-SWITCH partial bitstreams are applied cyclically in a pipeline fashion. In this particular instance, pr-SWITCH (NoC) clients are themselves partially reconfigurable Intellectual Property Cores (IP-Cores) located in a set of partial reconfiguration Slots (pr-Slot) (see 'N' pr-SLOT clients 28-34). This combination of pr-SWITCH and multiple pr-SLOT clients is intended as an example of a system architecture employing pr-SWITCH technology.

Figure 3:
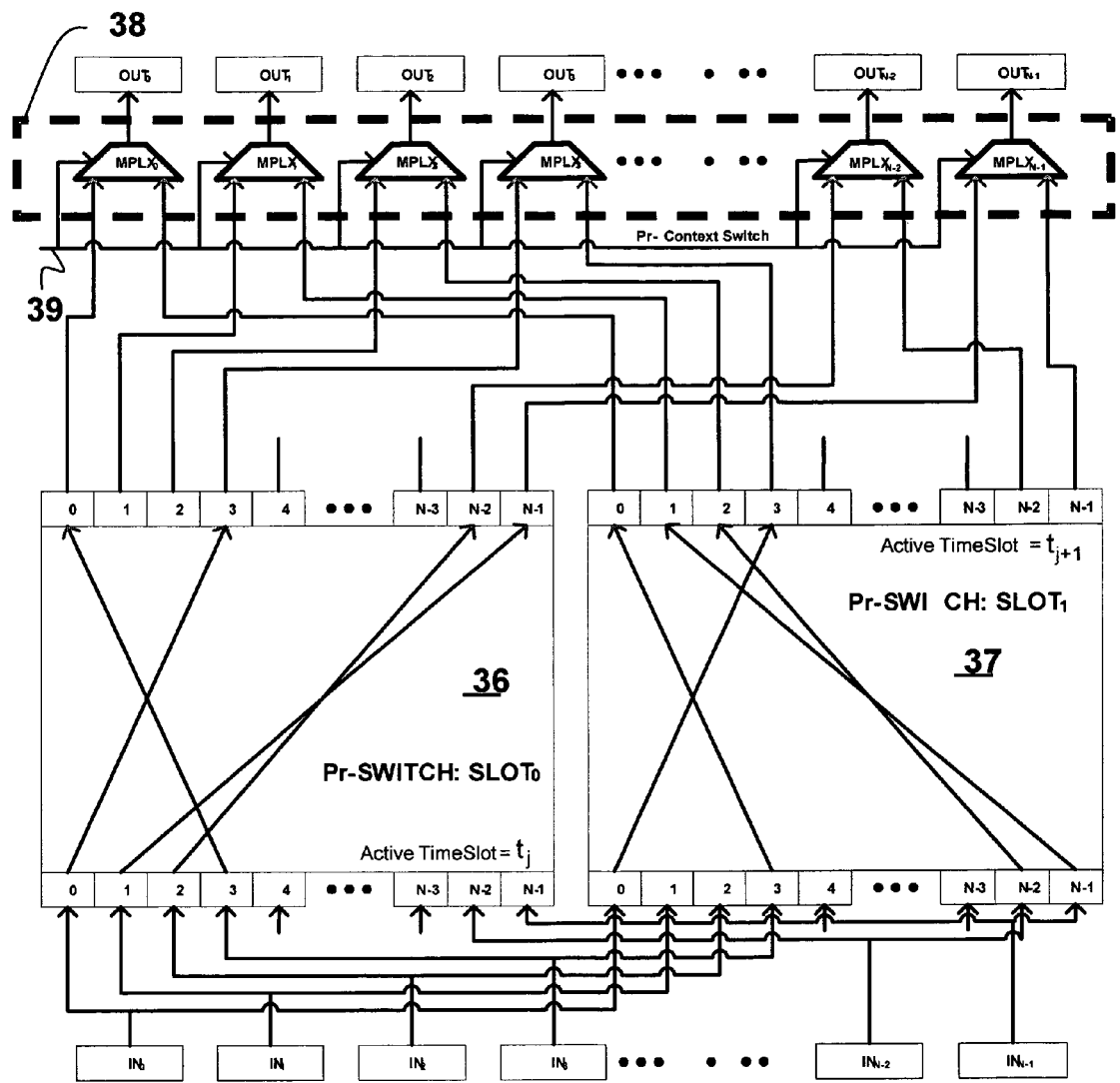
FIG. 3 illustrates a detailed schematic block diagram of the partially reconfigurable switch interconnect to which cyclically permuted partial bitstreams are applied and where interconnect fabric is implemented in terms of some reduced set of direct cross connects in accordance with an embodiment of the present invention.

Referring to FIG. 3, details of an example 4-of-N pr-SWITCH context-swap fabric 35 is displayed in accordance with an embodiment of the present invention. The pr-SWITCH 35 can include two partial reconfiguration SLOTs (pr-SLOT) 36 and 37 in combination with a multiplexer structure 38 controlled by a synchronous context switch control signal 39. Note the appearance of multiplexer fabric at each pr-SWITCH port. Multiplexer control is configured in such manner that IP-Core ports are always connected to the pr-SLOT within which the active pr-SWITCH cross-connects reside. Any new pr-SWITCH partial bitstream corresponding to a new K-of-N switch connection ensemble is then loaded from auxiliary memory into the inactive pr-SLOT as a background process. Given sufficient persistence of an active pr-SWITCH bitstream, the partial reconfiguration latency may be completely hidden as a pipelined memory access process. In this example, pr-SLOT0 36 is active at current time-slot $\tau_J$, and pr-SLOT1 37 is preloaded with a new set of 4-of-N cross-connects that becomes active at time-slot $\tau_{J+1}$. Note pr-SWITCH boundaries are defined at the pr-SLOT I/O ports. With exception of any partially reconfigurable pr-SWITCH clients that might be employed, all else remains part and parcel of the static design. Network interface boundaries are defined at multiplexer fabric I/O ports. Note use of direct cross-connects in any partial bitstream may be interpreted as a zeroth-order reduced-crossbar implementation resulting in topological connectivity equal to a fixed number of direct cross connects.

Figure 4:
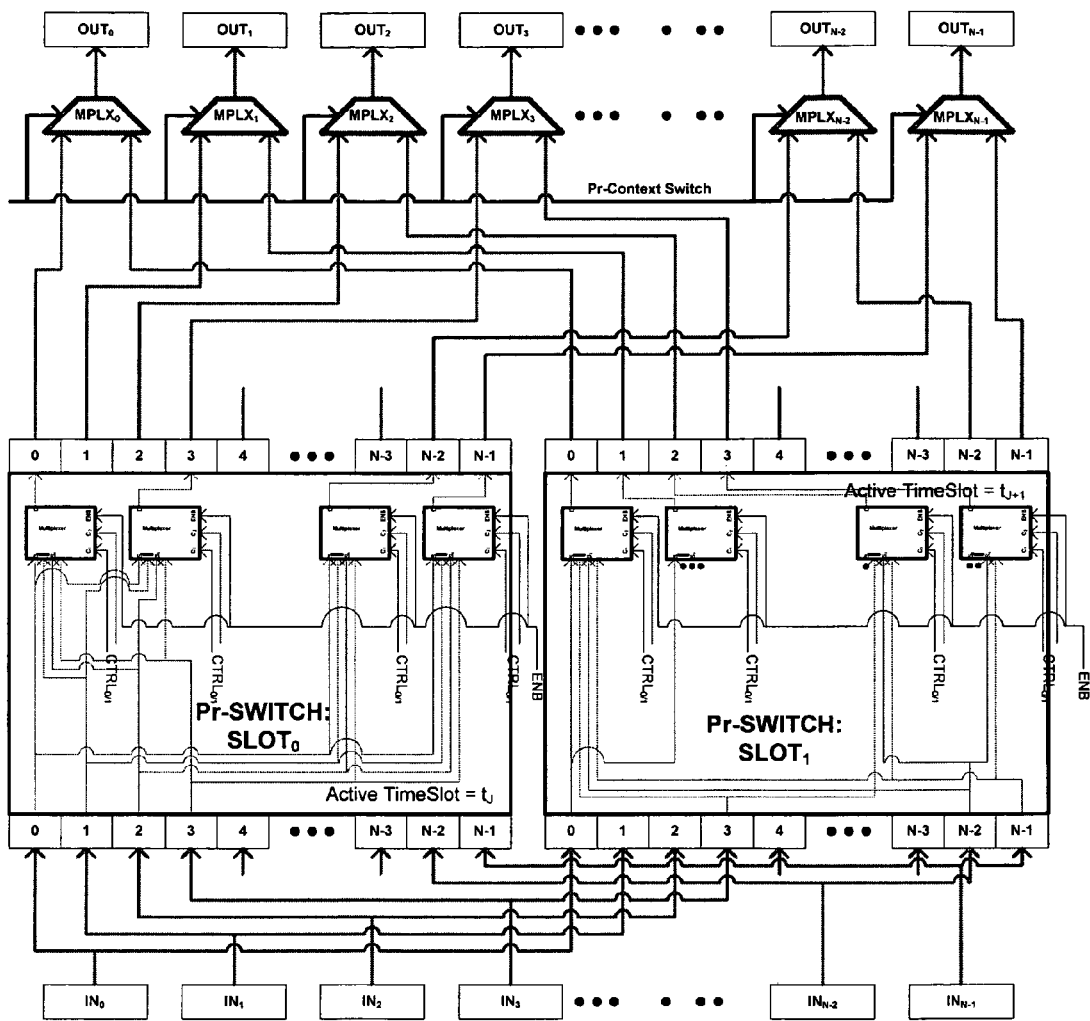
FIG. 4 illustrates an alternative reduced crossbar implementation for the partially reconfigurable interconnect fabric offering higher topological connectivity for identical input/output port connection order in accordance with an embodiment of the present invention.

Referring to FIG. 4, an alternative reduced-crossbar implementation 40 is created in form of 4-input multiplexers exhibiting 4×4 port-boundary connections identical to that shown in FIG. 3. In this case however, given some selected set input/output ports, any input port may be routed to any output port part and parcel of multiplexer control. Thus, topological connectivity is equivalent to that of a full 4×4 crossbar on those selected input and output ports. For an assumed isomorphic mapping between 4-input and 4-output ports, the topological connectivity is then 4!=4×3×2×1=24. Note for the 'x4' example in question, specific cross-connections are still implemented 4-at-a-time as dictated by ancillary ($\log_2(4)=2$) multiplexer control bits applied in conjunction with an optional multiplexer enable. These signals jointly form a control envelope accessible via hardware FSM or software API. Note topologically equivalent partially reconfigurable switch fabric structures may be created based upon the multilayer Clos-Switch architectural form, via an essentially equivalent procedure.

Figure 5:
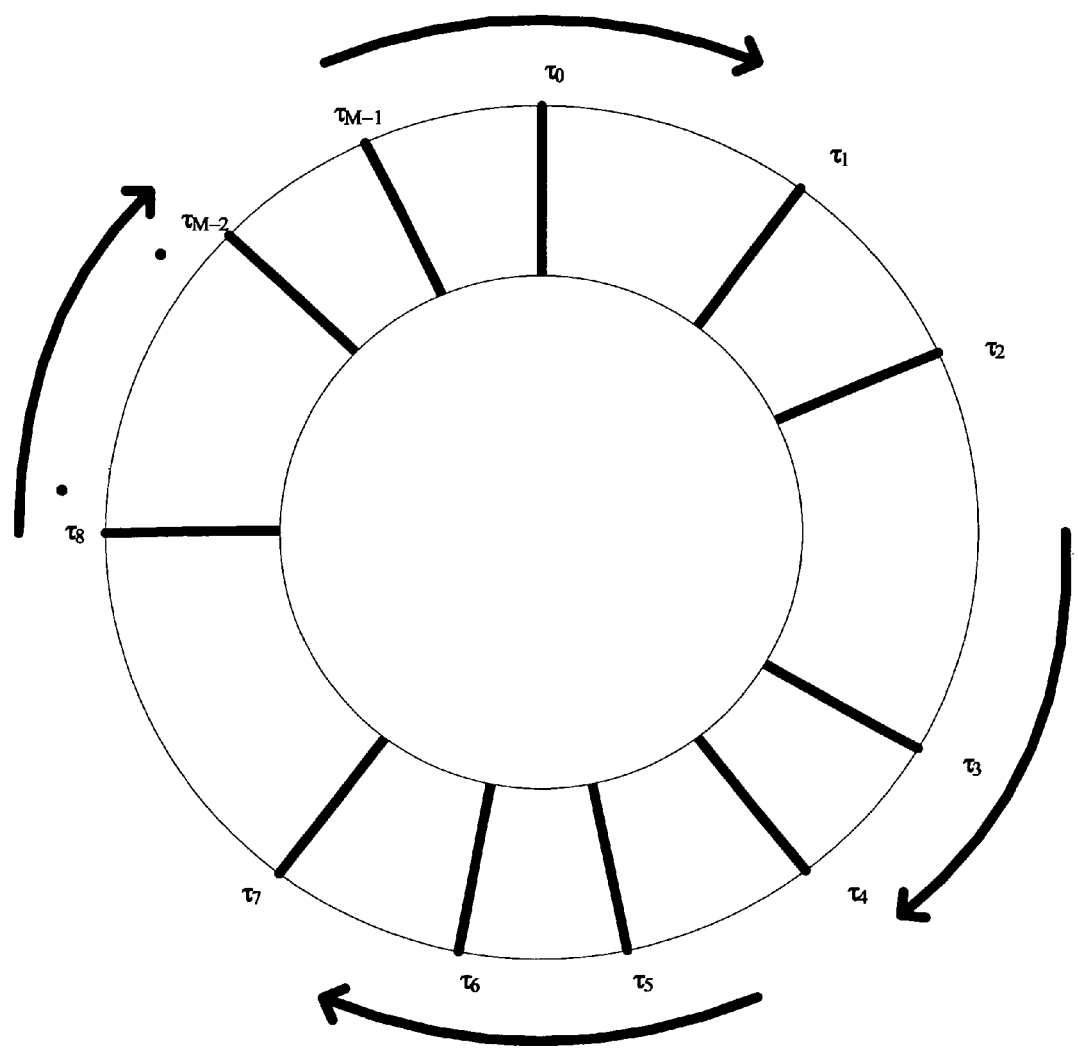
FIG. 5 illustrates cyclic permutation of applied K-of-N pr-SWITCH partial bitstreams in accordance with an embodiment of the present invention.

Referring to FIG. 5, a complete set of N-of-N pr-SWITCH connections is represented in form of a cyclically permuted sequence of 'M' component K-of-N partial bitstreams 45. Note component K-of-N bitstreams are not necessarily disjoint. A priori specified ordering of applied partial bitstreams enables cyclic bitstream pre-fetch in form of pipelined instancing of successive K-of-N bitstreams. An auxiliary Finite State Machine (FSM) can generate and apply all required pr-SWITCH/pr-SLOT context (multiplexer) switch control signals for zero-latency (lossless) synchronous instancing of component K-of-N partial bitstreams. K-of-N partial bitstreams and associated persistence times ($\tau_{J+1}-\tau_J$; J$\epsilon$[0 μM−1]) can be architected to implement guaranteed point-to-point average bandwidth based upon a total cyclic permutation time, K-value, and M-value for the set of component K-of-N links. Where the direct cross-connect implementation is considered, (refer to FIG. 3), GO/NOGO protocol signals for each client are included part and parcel with each K-of-N partial bitstream as basis for creation of non-arbitrated Time Division Multiplexed (TDM) Network-on-Chip (NoC). Protocol signals may include but are not restricted to standard Clear To Send (CTS), Receive Data (RD), and network source/destination ADDRESS signals. Where multiplexers are employed in the cross-connect fabric, (refer to FIG. 4), protocol signals must be applied externally depending upon specific multiplexer control settings.

A major advantage to be associated with use of interconnect fabric based upon pr-SWITCH is reduced area and reduced requirement for (often scarce) FPGA hierarchical interconnect resources. Logically, any area or resource constraints in this regard lead to constrained maximum K-of-N possible interconnection instances at any partial reconfiguration cycle. Traditional BUS/Platform or NoC-based interconnect allows fine-grained concurrent arbitrated access on part of all clients. On the surface, pr-SWITCH operates in a very different manner due to the fact a specific interconnect link may be absent for a given pair of clients, for a significant period of time. This is due to a combination of (1) total cyclic permutation time, and (2) intervening K-of-N partial bit-STREAM (pb-STREAM) instantiations. However, the difference is actually one of degree rather than categorical in that concurrent access may indeed be discerned at an appropriately large time scale. Thus, concurrent client access for pr-SWITCH is seen to be coarse-grained relative to BUS/NoC counterparts. However, a significant difference accrues in that pr-SWITCH based NoC engenders essentially no arbitration loss. This lack of arbitration loss is gained at expense of generally larger I/O buffers required at each client, (i.e., the more coarse grained (concurrent) access may give rise to a requirement for larger I/O buffers). Another logical implication is any reduction possible to the time-scale associated with concurrent access, (e.g. via pipelining), the smaller I/O buffer requirements are likely to be.

Maximum K-of-N interconnect at any pr-SWITCH instantiation does not constitute a fundamental problem as long as I/O buffers are sufficiently large, (i.e., so as to accommodate any accumulated data). Note I/O buffer size may be minimized if pr-SWITCH instances are designed to provide a complete set of required connections in a minimum number of partial bitstream instantiations, and subject to the max K-of-N constraint. Further, as with traditional BUS/NoC, clients must know (1) when interconnect is available, and (2) an associated source/destination address. This information is typically provided within context of an interconnect protocol.

Partial reconfiguration involves a performance overhead due to the fact a partial bitstream is fetched and applied to the FPGA configuration-plane. This overhead consists of power and time components, with the latter assuming dominant importance, (e.g. power-budget impact remains minimal due to a typically low (partial reconfiguration) duty-cycle). The temporal overhead in turn directly impacts client I/O buffer size, as described above. This problem may be addressed via pipelining of applied partial bitstreams wherever possible. In this context, pipelining consists of two components: (1) partial bitstream prefetch, and (2) silicon-backplane context switch. Note, a 'Silicon Backplane' refers to a second (or additional) partial reconfiguration SLOT to which prefetched partial bitstreams are targeted and effectively multiplexed with the pr-SLOT within which an already instanced partial bitstream resides. At an appropriate juncture, the multiplexed pr-SLOTs are switched rendering the prefetched partial bitstream as the current instance, and the previous pr-SLOT inactive and available for a subsequent prefetch.

pr-SWITCH is by nature an aggregate interconnect resource in that access control is necessarily performed by a centralized resource. This is due in main to the fact all instanced connections refer to a single partial bitstream, (i.e., subject to unitary control). In this respect, pr-SWITCH control is similar to that of a BUS, and distinct from a NoC where control is nominally distributed. For aggregated control, pipelining must be added sufficient to remove any degeneracy induced by control/data path differential delay. Thus, the issue essentially resolves to one of acceptable interconnect latency. This latency is predictable for a pr-SWITCH, and may be evaluated a priori for satisfaction of system performance constraints.

Assume specification of some set of K-of-N interconnect ensembles, and subsequent generation of corresponding partial bit-STREAMs (pb-STREAM). These pb-STREAMs are then applied in cyclically permuted order to a silicon backplane construct. Total cyclic permutation time is sufficiently large such that individual partial reconfiguration times are completely hidden. In this manner, application of a given pb-STREAM is pipelined with a current pb-STREAM instance and the new pb-STREAM instanced via a simple synchronous context switch. Further, where a direct cross-connect fabric is employed, (refer to FIG. 3), it is assumed that the Clear To Send (CTS), Receive Data (RD), (or equivalent) and destination/source addresses at each client are included with each partial bitstream, for each K-of-N ensemble element, (i.e., constituent interconnection). Assuming appropriate control sequencing, client buffer-to-buffer transmission may then immediately proceed with essentially no intervening hardware arbitration. Where a reduced-crossbar implementation is considered, (refer to FIG. 4), a higher level software API or FSM control interface may be employed for application of protocol signals in conjunction with multiplexer control/enable signals. Note the sum of instantiation times for each K-of-N bitstream is constrained to equal an a priori determined cyclic permutation time. Thus, subject to this constraint, instantiation time for each K-of-N pb-STREAM may be set in proportion to all others. In this manner, guaranteed bandwidth for each client-to-client interconnect may be set, and client buffer sizes accordingly calculated, (e.g. per appropriately characterized statistical expectations).

Referring again to the system 20 of FIG. 2, 'N' pr-SLOT clients (28-34) are attached to a pr-SWITCH interconnect fabric 12. All pr-SLOTs and the pr-SWITCH can utilize a silicon backplane (e.g., all associated pb-STREAMs may be pipelined). Each pr-SWITCH port can include CTS, RD, and ADR ports (18, 16, and 14) as shown. Associated values are instantiated with each of 'M' pr-SWITCH K-of-N instances. ADR is interpreted as SOURCE/DESTINATION address according to context, (e.g., whether CTS or RD is applicable). pr-SWITCH/pb-STREAM instantiations can be stored in reserved peripheral memory (such as SRAM 26) and pipelined as cyclic permutations according to an associated RISC-resident Finite State Machine (FSM) control. The RISC-resident FSM control can include a RISC processor 20 as well as a Configuration-Plane Access port 22 and an associated Block Random Access Memory (BRAM) 24. Note that reserved proportional bandwidth for each pr-SWITCH pb-STREAM may be dynamically varied by the control FSM, (e.g., subject to the total cyclic permutation time constraint).

Embodiments herein can provide a practical means to employ a reconfigurable switch as Network-on-Chip (NoC) fabric. Unfortunately, there exists a basic problem where the reconfigurable switch is considered in this capacity, namely that lengthy partial reconfiguration time intervals within context of an arbitrated access protocol would render the network highly inefficient (from a percentage utilization or a maximum traffic density point of view). Thus, cyclic pipelining or cyclically permuted partial bitstreams is used to completely hide reconfiguration time, obviate all arbitration, and reduce access protocol to simplest terms. More specifically, partial bitstreams are defined for every desired set of network connections, placed in a buffer (such as SRAM 26), and then applied in cyclic fashion to the switch 12. Further, application of partial bitstreams is performed as a 'background' process on what amounts essentially to a 'silicon backplane' structure. Thus, network traffic is concurrent with application of the partial bitstream and a context switch applied for activation of a new set of network connections. Note as far as network traffic is concerned, the reconfiguration time essentially doesn't exist.

The issue of network protocol remains. Typically, network access is requested by clients and serviced by network arbitration. That is to say, network access is typically asynchronous. Embodiments here can replace asynchronous network arbitration with non-arbitrated, synchronous access. Essentially, a specific connection is indicated at the associated clients by a set of flags contained in the partial bitstream. The associated (partial bitstream) controller can then determine connection instance and duration. As a result, protocol is stripped to barest essentials, (e.g., 'GO', 'NOGO'). Further, some average bandwidth at any connection is guaranteed by the cyclic nature of the partial reconfiguration control. The ramifications are twofold: (1) in general, traffic must be buffered at any client, and (2) the system designer should correctly bound required traffic density in order to specify client buffer sizes. '1' is suggestive of Kahn Process type client processing models. '2' is suggestive of the typical queuing simulations that must be performed for most network infrastructure designs.

System performance will depend upon how many switch connections can be simultaneously maintained. Simply put, the more the better. Considering a (partially reconfigurable) switch supporting connections from N sources to N sinks: For any source, (N−1) sinks are possible. If a second concurrent connection is considered, (N−2) sinks are possible. Proceeding inductively, the total number of possible connections for the entire switch is (N−1)!, (i.e., 'N−1' factorial). This is potentially a large number. However, for most practical designs, relatively few of all possible are actually required. Note assumption of unitary connections, (i.e., single source to single sink), implies only 'N' connections of all possible may in principle be simultaneously supported at any given time. However, due to implementation constraints of one form or another, it may occur only 'K', (where K<N), which might actually be supported. Thus, from the set of all desired connections, only K-of-N are instanced at any given time. The partial reconfiguration controller will then share network bandwidth 'K-at-a-time' among all desired connections. Note, where the reduced-crossbar implementation is considered, generally fewer partial bitstreams will be required for complete coverage of all required cross-connections due to the higher topological connectivity that may be achieved in any bitstream instance. This advantage accrues at a cost of greater complexity and higher resource utilization requirements.

The resulting communications infrastructure should prove highly efficient. Certainly a generally smaller size than traditional packet-switched or ATM styled versions can be expected. Further, network overhead in the form of access negotiation and contentions are eliminated. Note the synchronous nature of this network fabric drives an additional buffering constraint at each network client. This can actually prove quite punitive for some applications. Further, background partial bitstream application essentially doubles the network area requirement. In the former, synchronous pr-SWITCH based NoC should still prove quite amenable to broad (and exceedingly useful) classes of dataflow processing, (e.g. modified Kahn-Process network). In the latter, the background process will enable efficient use of peripheral mass storage resources, (e.g., L-2 cache, Network File System). Thus, in the balance and in spite of noted costs, NoC based upon the described (cyclically permuted) partially reconfigurable switch may prove a valuable FPGA system design alternative.

Figure 6:
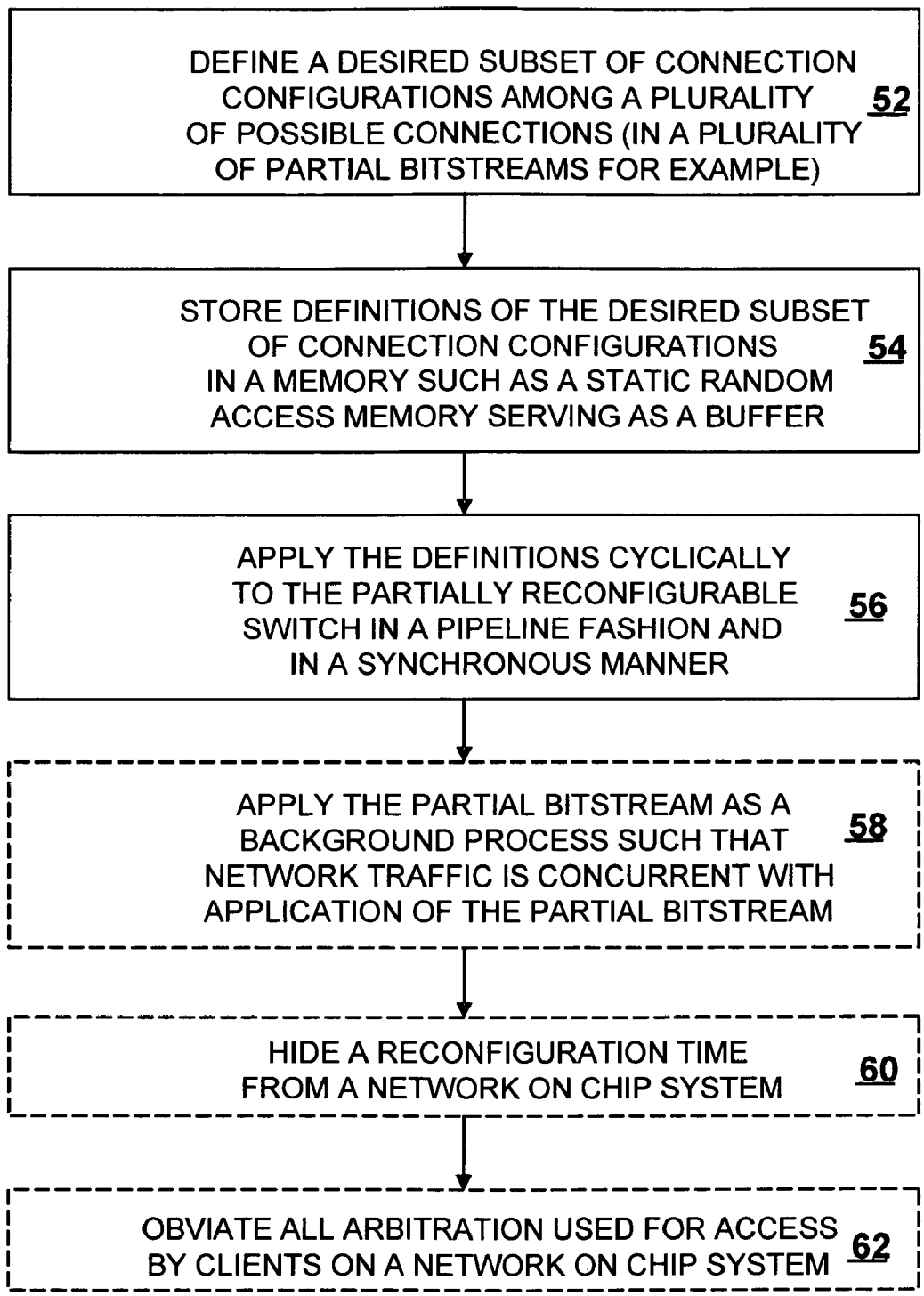
FIG. 6 is a flow chart illustrating a method of configuring a partially reconfigurable switch in accordance with an embodiment of the present invention.

Referring to FIG. 6, a flow chart illustrating a method 50 of configuring a partially reconfigurable switch can include the step 52 of defining a desired subset of connection configurations among a plurality of possible connections, storing definitions of the desired subset of connection configurations in a memory at step 54, and applying the definitions cyclically to the partially reconfigurable switch in a pipeline fashion at step 56. Defining the desired subset of connection configurations can involve defining a plurality of partial bitstreams. Applying the definitions cyclically can be done in a synchronous manner and storing definitions can be done by placing the definitions in a static random access memory serving as a buffer. The method 50 can further include the step 58 of applying the partial bitstream as a background process such that network traffic is concurrent with application of the partial bitstream. As a result, the method 50 can further include hiding a reconfiguration time from a network on chip system at step 60 and obviating all arbitration used for access by clients on a network on chip system at step 62.

In light of the foregoing description of the invention, it should be recognized that the present invention can be realized in hardware, software, or a combination of hardware and software. A method and system configuring a partially reconfigurable switch according to the present invention can be realized in a centralized fashion in one FPGA-based platform system, or in a distributed fashion where different elements are spread across several interconnected FPGA-based processing modules. A typical combination of hardware and software could be a FPGA-based System-on-Chip containing a processor executing a program that, when being loaded and executed, applies system-level control such that it carries out the invention described herein.

The present invention can also be embedded in a computer program product, which comprises all the features enabling the implementation of the methods described herein, and which, when loaded in an FPGA-based System-on-Chip (SoC) or NoC, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Additionally, the description above is intended by way of example only and is not intended to limit the present invention in any way, except as set forth in the following claims.

What is claimed is:

1. A method of configuring a partially reconfigurable switch, comprising the steps of:
   defining a plurality of desired subsets of connection configurations among a plurality of possible connections;
   storing definitions of the desired subset of connection configurations in a memory;
   wherein the plurality of possible connections includes n possible connections, and two or more of the definitions configure the reconfigurable switch to switchably couple at least one and fewer than n of the possible connections; and applying the definitions cyclically to the partially reconfigurable switch in a pipeline fashion;

wherein the definitions applied include the two or more of the definitions, and when the partially reconfigurable switch is configured with one of the two or more of the definitions, only the at least one and fewer than n of the Possible connections are switchably coupled.

2. The method of claim 1, wherein the step of defining a desired subset of connection configurations comprises defining a plurality of partial bitstreams.

3. The method claim 1, wherein the method further comprises the step of hiding a reconfiguration time from a network on chip system.

4. The method of claim 1, wherein the method further comprises the step of obviating all arbitration used for access by clients on a network on chip system.

5. The method of claim 1, wherein the step of applying the definitions cyclically is done in a synchronous manner.

6. The method of claim 1, wherein the step of storing definitions comprises placing the definitions in a static random access memory serving as a buffer.

7. The method of claim 1, wherein the method further comprises the step of applying the partial bitstream as a background process such that network traffic is concurrent with application of the partial bitstream.

8. A pipelined partially reconfigurable switch interconnect, comprising:
a plurality of desired subsets of connections in a switch interconnect;
wherein the switch interconnect provides n possible connections;
a respective partial bitstream defined for each of the desired subsets of connections stored in a memory serving as a buffer;
wherein two or more of the respective partial bitstreams configure the reconfigurable switch interconnect to switchably couple at least one and fewer than n of the possible connections; and
a controller for cyclically applying the partial bitstream defined for each of the desired subsets of connections to the switch interconnect
wherein the partial bitstreams applied include the two or more of the respective partial bitstreams, and when the partially reconfigurable switch is configured with one of the two or more of the respective partial bitstreams, only the at least one and fewer than n of the possible connections are switchably coupled.

9. The switch interconnect of claim 8, wherein the controller determines a connection instance and duration for each client access of the switch interconnect in a synchronous manner.

10. The switch interconnect of claim 8, wherein the switch interconnect further comprises a context switch applied to the switch interconnect for activation of a new set of network connections in a network on chip configuration.

11. The switch interconnect of claim 8, wherein the memory comprises a static random access memory or SRAM.

12. The switch interconnect of claim 8, wherein the controller comprises a RISC based finite state machine using a configuration plane access port and an associated block random access memory.

13. The switch interconnect of claim 8, wherein a clear to send (CTS), receive data (RD), destination address, and source address at each client are sent with each partial bitstream for each desired subset of connections.

14. The switch interconnect of claim 8, wherein the partially reconfigurable switch and a plurality of partially reconfigurable slot clients comprises a silicon backplane.

15. A pipelined partially configurable switch interconnect, wherein the switch interconnect provides n possible connections, comprising:
a plurality of K-of-N interconnect ensembles providing respective partial bitstreams; and
wherein two or more of the respective partial bitstreams configure the reconfigurable switch interconnect to switchably couple at least one and fewer than n of the Possible connections; and
a silicon backplane construct coupled to the plurality of interconnect ensembles, wherein the partial bitstreams are applied in a cyclically permutated order to the silicon backplane
wherein the partial bitstreams applied to the silicon backplane include the two or more of the respective partial bitstreams, and when the silicon backplane is configured with one of the two or more of the respective partial bitstreams, only the at least one and fewer than n of the possible connections are switchably coupled.

16. The pipelined partially configurable switch interconnect of claim 15, wherein a total cyclical permutated time is sufficiently large enough to maintain partial reconfigurable times hidden.

17. The pipeline partially configurable switch interconnect of claim 15, wherein the switch interconnect further comprises a context switch, wherein application of a partial bitstream is pipelined with a current partial bitstream instance in a synchronous and lossless manner with the context switch.

18. The pipeline partially configurable switch interconnect of claim 15, wherein a clear to send (CTS), receive data (RD), destination address, and source address at each client are sent with each partial bitstream for each K-of-N interconnect ensemble.

19. The pipeline partially configurable switch interconnect of claim 15, wherein the switch interconnect further comprises reserve peripheral memory that stores partial reconfigurable partial bitstreams in static random access memory.

20. The pipeline partially configurable switch interconnect of claim 15, wherein the switch interconnect further comprises a reduced instruction set controller coupled to the switch interconnect to control pipelining.

* * * * *